(12) United States Patent
Narazaki et al.

(10) Patent No.: US 8,178,365 B2
(45) Date of Patent: May 15, 2012

(54) METHOD OF MANUFACTURING SEMICONDUCTOR DEVICE

(75) Inventors: Atsushi Narazaki, Chiyoda-ku (JP);
Yukio Matsushita, Chiyoda-ku (JP);
Masashi Osaka, Chiyoda-ku (JP);
Shunsuke Sakamoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/011,263

(22) Filed: Jan. 21, 2011

(65) Prior Publication Data

US 2011/0244604 A1    Oct. 6, 2011

(30) Foreign Application Priority Data

Apr. 1, 2010   (JP) .................................. 2010-085068

(51) Int. Cl.
*G01R 31/26* (2006.01)
(52) U.S. Cl. ..................... 438/14; 438/17; 257/E21.382; 257/E29.066; 257/E29.197; 324/762.01; 324/762.08
(58) Field of Classification Search .............. 438/14–18; 257/E29.197, E29.066, E21.382; 324/762.01, 324/762.08, 762.09
See application file for complete search history.

(56) References Cited

U.S. PATENT DOCUMENTS

| 5,196,354 A | * | 3/1993 | Ohtaka et al. | ................. 438/268 |
| 2003/0199145 A1 | * | 10/2003 | Noguchi | ........................ 438/291 |

FOREIGN PATENT DOCUMENTS

| JP | 62-055964 | 3/1987 |
| JP | 62-166632 | 10/1987 |
| JP | 63-134541 | 9/1988 |
| JP | 11-345851 | 12/1999 |
| JP | 2000-200792 | 7/2000 |
| JP | 2006-352101 | 12/2006 |

* cited by examiner

*Primary Examiner* — Khiem D Nguyen
(74) *Attorney, Agent, or Firm* — Oblon, Spivak, McClelland, Maier & Neustadt, L.L.P.

(57) ABSTRACT

A semiconductor wafer having IGBT elements and transistors formed on a surface thereof is prepared. Electron beams are emitted all over the surface of the semiconductor wafer. Recombination centers are formed in the IGBT elements and the transistors. ON voltages of the transistors are measured by a measurement device, and lifetimes defined in the IGBT elements and the transistors are recovered by a prescribed annealing treatment. When the lifetimes are recovered, a control device controls an annealing treatment amount in the annealing treatment based on the measured ON voltages of the transistors such that ON voltages of the IGBT elements are each equal to a desired ON voltage. Variations in the ON voltages of a plurality of IGBT elements obtained from the semiconductor wafer are reduced.

6 Claims, 14 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and in particular to a method of manufacturing a semiconductor device including a step of controlling a lifetime.

2. Description of the Background Art

Japanese Patent Laying-Open No. 62-055964 discloses a transistor formed on a semiconductor wafer. The transistor is independent of main chips in a power transistor to measure a current amplification factor. The publication describes that, by using the transistor measuring the current amplification factor, a main chip having a large variation in the current amplification factor can be selected from a plurality of main chips obtained from the semiconductor wafer.

Japanese Patent Laying-Open No. 2006-352101 describes that, when a plurality of semiconductor devices are prepared, concentrations of impurities originally contained in these semiconductor devices before fabrication thereof vary for each semiconductor device. The publication discloses a method of substantially equalizing such variations. In the method, a large amount of impurities are introduced into a semiconductor device when a semiconductor region is formed. The publication describes that the variations described above are substantially negligible by the introduction of a large amount of impurities.

Japanese Patent Laying-Open No. 2000-200792 discloses a method of manufacturing an IGBT (Insulated Gate Bipolar Transistor). In the method, electron beams of several MeV (Mega electron Volt) are emitted to the IGBT. Emission of the electron beams reduces the lifetime of the IGBT. Emission of the electron beams damages a gate oxide film and an interface between the gate oxide film and a channel region. The damage is recovered by an annealing treatment performed after the emission.

SUMMARY OF THE INVENTION

When a plurality of main chips (for example, IGBT elements) are obtained from a semiconductor wafer, ON voltages of the main chips may vary.

One object of the present invention is to provide a method of manufacturing a semiconductor device capable of reducing variations caused in ON voltages of a plurality of main chips obtained from a semiconductor wafer.

A method of manufacturing a semiconductor device according to an aspect of the present invention includes the following steps. A semiconductor wafer is prepared. On a surface of the semiconductor wafer, a plurality of first semiconductor elements each having a prescribed ON voltage and a plurality of second semiconductor elements each having another prescribed ON voltage and an area smaller than that of the first semiconductor element are formed.

Prescribed radioactive rays or prescribed ions are emitted all over the surface of the semiconductor wafer. Recombination centers are formed in the first semiconductor elements and the second semiconductor elements. Lifetimes of the first semiconductor elements and lifetimes of the second semiconductor elements are defined by forming the recombination centers. The other prescribed ON voltages of the second semiconductor elements are measured, and the semiconductor wafer is subjected to a prescribed annealing treatment. The lifetimes of the first semiconductor elements and the lifetimes of the second semiconductor elements are recovered.

An annealing treatment amount in the annealing treatment is controlled based on the other prescribed ON voltages of the second semiconductor elements as measured, such that ON voltages of the first semiconductor elements are each equal to a desired ON voltage when the lifetimes of the first semiconductor elements are recovered.

A method of manufacturing a semiconductor device according to another aspect of the present invention includes the following steps. A semiconductor wafer is prepared. On a surface of the semiconductor wafer, a plurality of first semiconductor elements each having a prescribed ON voltage and a plurality of second semiconductor elements each having another prescribed ON voltage and an area smaller than that of the first semiconductor element are formed.

Prescribed radioactive rays or prescribed ions are emitted all over the surface of the semiconductor wafer. Recombination centers are formed in the first semiconductor elements and the second semiconductor elements. Lifetimes of the first semiconductor elements are defined by forming the recombination centers. The semiconductor wafer is subjected to a preheating treatment. The lifetimes are recovered. The other prescribed ON voltages of the second semiconductor elements are measured. The plurality of first semiconductor elements are subjected to a prescribed annealing treatment. The lifetimes are recovered.

An annealing treatment amount in the annealing treatment is controlled based on the other prescribed ON voltages of the second semiconductor elements as measured, such that ON voltages of the first semiconductor elements are each equal to a desired ON voltage.

According to the present invention, a method of manufacturing a semiconductor device capable of reducing variations in ON voltages caused in a plurality of main chips obtained from a semiconductor wafer can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
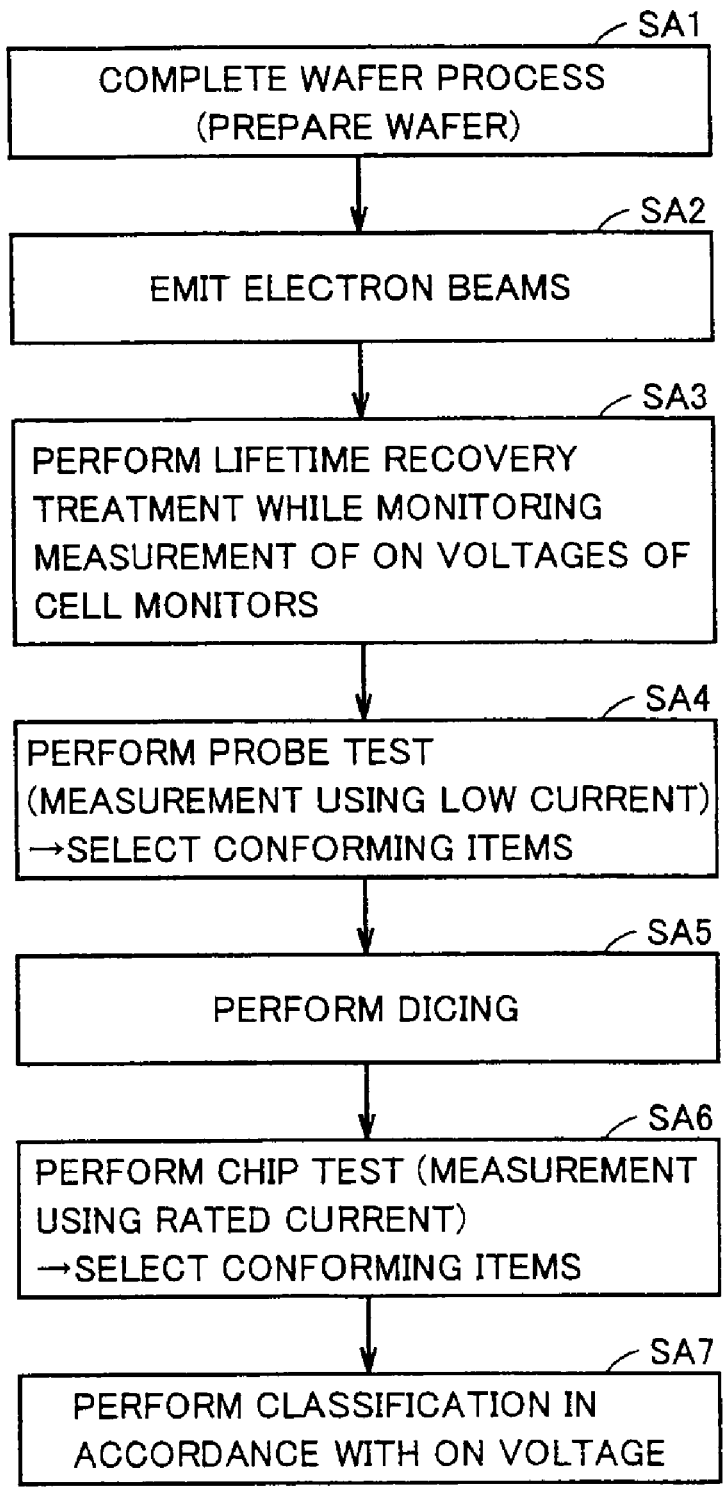
FIG. 1 is a view showing steps of a method of manufacturing a semiconductor device in Embodiment 1.

Hereinafter, a method of manufacturing a semiconductor device in embodiments according to the present invention will be described with reference to the drawings. When the number, amount, or the like is referred to in the description of the embodiments, the scope of the present invention is not necessarily limited to such a number, amount, or the like, unless otherwise specified. In the description of the embodiments, identical or corresponding parts will be designated by the same reference numerals, and an overlapping description may not be repeated.

[Embodiment 1]

Referring to FIGS. 1 to 13, a method of manufacturing a semiconductor device in the present embodiment will be described. Referring to FIG. 1, the method of manufacturing a semiconductor device in the present embodiment includes steps SA1 to SA7. Hereinafter, steps SA1 to SA7 will be described in order.

(Step SA1)

Figure 2:
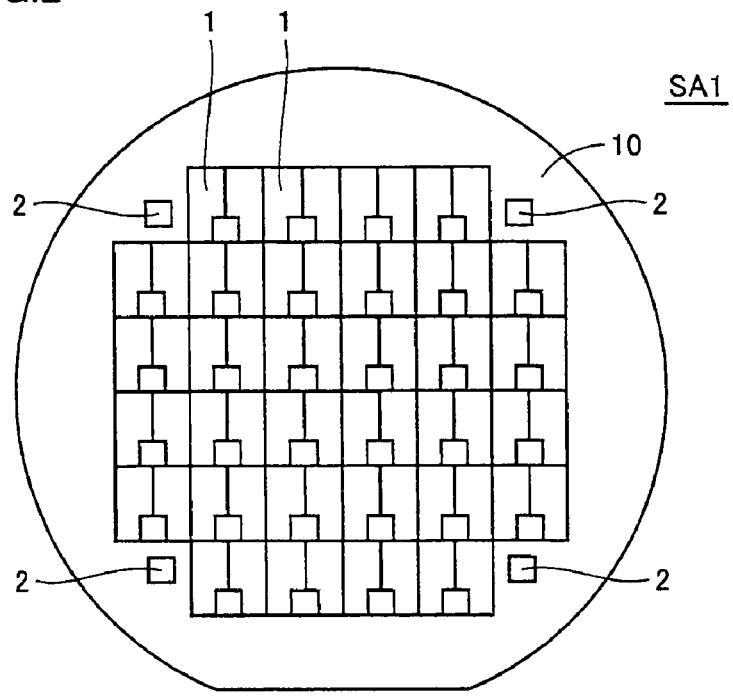
FIG. 2 is a plan view showing a first step of the method of manufacturing a semiconductor device in Embodiment 1.

Referring to FIG. 2, in step SA1, a semiconductor wafer 10 for which a prescribed process has been completed is prepared. On a surface of semiconductor wafer 10, a plurality of IGBT elements 1 (first semiconductor elements) and four transistors 2 (second semiconductor elements) are formed.

Each IGBT element 1 is a main chip. Each transistor 2 is a cell monitor. Transistors 2 are located at four corners of a region where the plurality of IGBT elements 1 are formed. Transistors 2 are formed at positions independent of the region where the plurality of IGBT elements 1 are formed. Transistor 2 has an area smaller than an area of IGBT element 1. The area of transistor 2 is, for example, about 1/1000 of the area of IGBT element 1.

(Step SA2)

Figure 3:
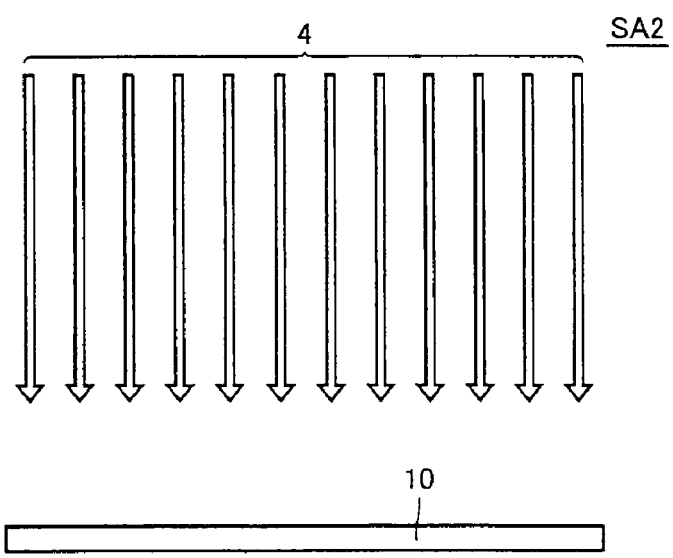
FIG. 3 is a cross sectional view showing a second step of the method of manufacturing a semiconductor device in Embodiment 1.

Referring to FIG. 3, in step SA2, electron beams 4 having a prescribed emission amount are emitted all over the surface of semiconductor wafer 10. Electron beams 4 have an acceleration voltage of, for example, about 0.5 MeV to about 1.0 MeV. Electron beams 4 have a dose amount of, for example, about 5 to $15 \times 10^{14}/cm^2$. Strains (also referred to as defects) are formed in a substrate (such as silicon) constituting IGBT elements 1 and transistors 2. The strains form recombination centers for minority carriers (electrons if the substrate is a p-type semiconductor material, and holes if the substrate is an n-type semiconductor material).

To form the recombination centers, $\alpha$ rays, $\gamma$ rays, X rays, neutron rays, or the like may be emitted all over the surface of semiconductor wafer 10 as radioactive rays. To form the recombination centers, He+, Ar+, or the like may be emitted all over the surface of semiconductor wafer 10 as ions (protons).

The minority carriers are captured (recombined) at the recombination centers. Lifetimes of the minority carriers are increased/decreased by adjusting the density and distribution of the recombination centers (lifetime control). ON resistances of IGBT elements 1 and transistors 2 are also increased/decreased by adjusting the density and distribution of the recombination centers. The lifetimes of the minority carriers are defined, for example, to about 5 to about 10 ns by the emission of electron beams 4.

(Step SA3)

Figure 4:
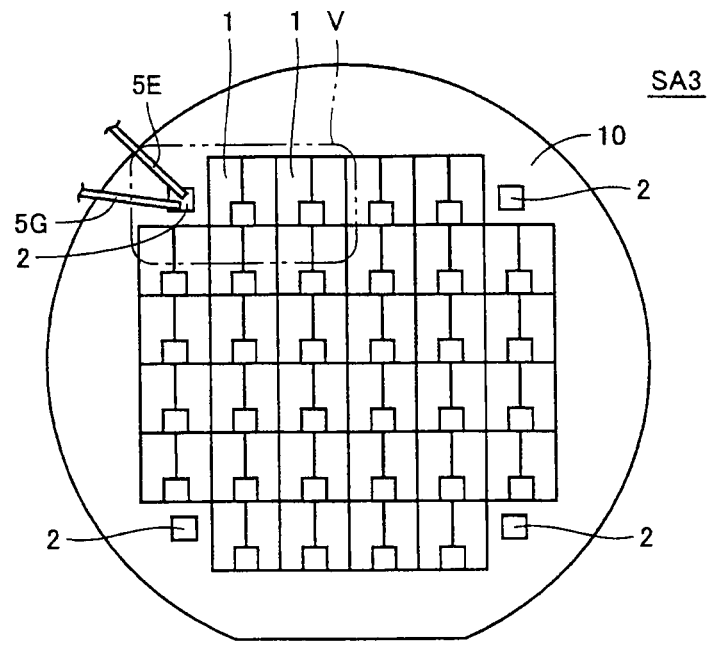
FIG. 4 is a plan view showing a third step of the method of manufacturing a semiconductor device in Embodiment 1.

Referring to FIG. 4, in step SA3, ON voltages of transistors 2 are measured. FIG. 4 shows a manner in which an ON voltage of one transistor 2 is measured. Preferably, it is desirable that four probe pins (the detail thereof will be described later) are prepared, and the ON voltages of transistors 2 at four corners are measured simultaneously.

Figure 5:
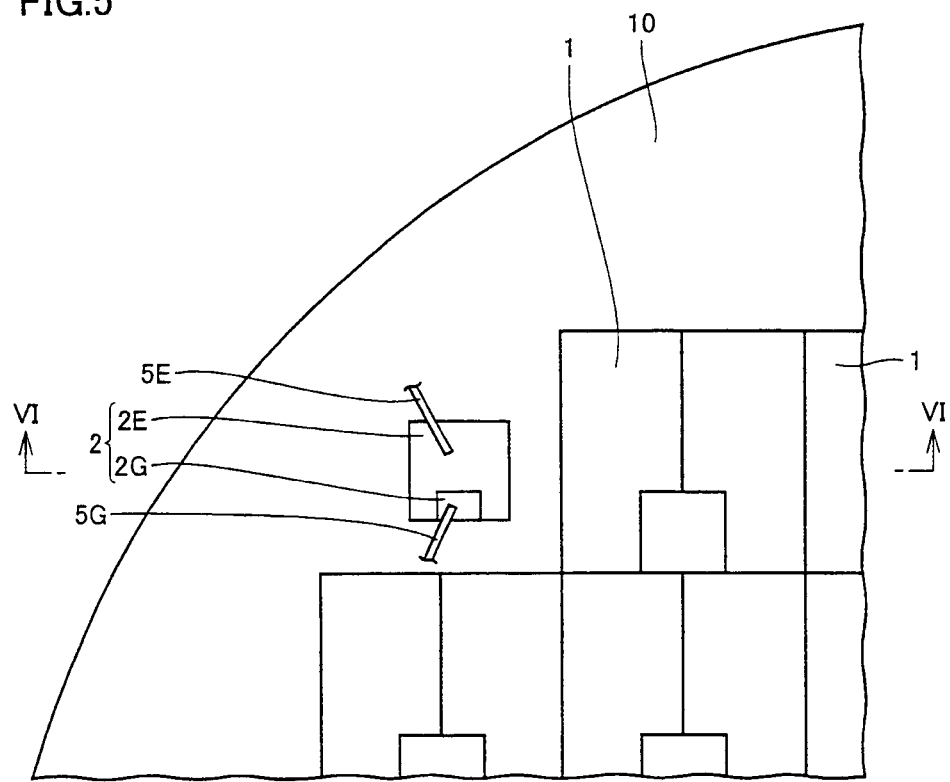
FIG. 5 is an enlarged plan view showing a region surrounded by a line V in FIG. 4.

FIG. 5 is an enlarged plan view showing a region surrounded by a line V in FIG. 4. Referring to FIG. 5, a gate terminal 5G is grounded to a gate 2G (base) of transistor 2. An emitter terminal 5E is grounded to an emitter 2E of transistor 2. Gate terminal 5G and emitter terminal 5E are each formed of a probe pin with a small diameter.

Figure 6:
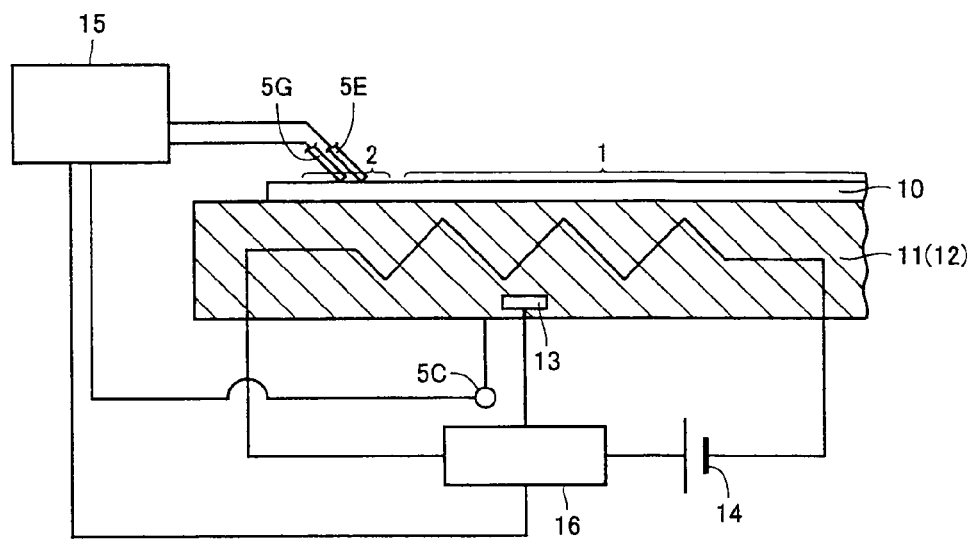
FIG. 6 is a cross sectional view taken along a line VI-VI in FIG. 5 and seen in the direction of arrows.

Referring to FIG. 6, a collector terminal 5C is grounded to a back surface electrode 11 (a collector of transistor 2) of semiconductor wafer 10. Terminals 5G, 5E, 5C are connected to a measurement device 15. When the ON voltage of transistor 2 is measured, a current lower than a rated current of IGBT element 1 is applied between emitter terminal 5E and gate terminal 5G.

Although a detailed operation will be described later, back surface electrode 11 has a built-in heater 12. Heater 12 is connected to a power source 14 and a control device 16. A temperature sensor 13 is attached to back surface electrode 11. Temperature sensor 13 is also connected to control device 16.

Properties of the plurality of IGBT elements 1 formed on semiconductor wafer 10 exhibit a certain tendency toward a prescribed direction. A distribution state of ON voltages in the plurality of IGBT elements 1 can be calculated based on measurement results of the ON voltages of transistors 2 formed at four corners.

It is also possible to calculate the ON voltages in IGBT elements 1 in an equivalent manner by setting currents to be applied to transistors 2 in accordance with rated currents of the plurality of IGBT elements 1 and current densities of the plurality of IGBT elements 1. For example, assume that the area of transistor 2 is 1/1000 of the area of IGBT element 1. If the rated currents of the plurality of IGBT elements 1 are 100 A, the currents to be applied to transistors 2 are set to 0.1 A. The ON voltages and the distribution state of the ON voltages in the plurality of IGBT elements 1 can be calculated with a high accuracy.

The ON voltages of transistors 2, the ON voltages of IGBT elements 1 calculated based on the ON voltages of transistors 2, and the distribution state of the ON voltages of IGBT elements 1 are input to control device 16. Control device 16 monitors these pieces of information, and at the same time drives heater 12. Semiconductor wafer 10 is subjected to a prescribed annealing treatment (for example, at a temperature of not less than 300° C.) by the drive of heater 12.

Lifetimes of IGBT elements 1 and lifetimes of transistors 2 are recovered (stabilized). Control device 16 controls an annealing treatment amount in the annealing treatment based on the ON voltages of transistors 2 such that the ON voltages of IGBT elements 1 are each equal to a desired ON voltage. The annealing treatment amount depends on temperature and time.

Figure 7:
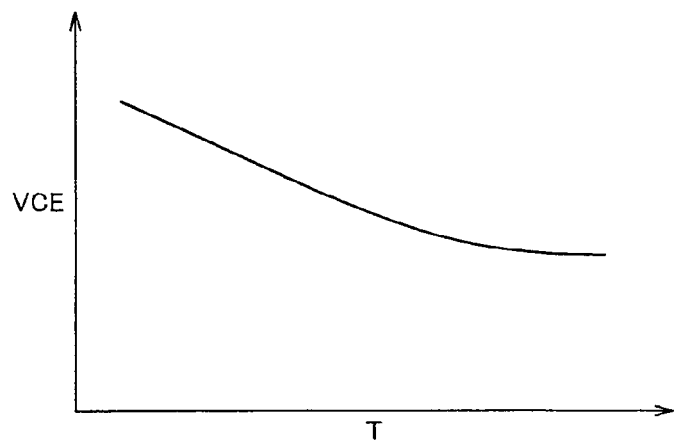
FIG. 7 is a view showing the relationship between an ON voltage VCE and an annealing treatment time T.

Referring to FIG. 7, as an annealing treatment time T is increased, a lifetime recovery amount is increased, and an ON voltage VCE is decreased. Referring to FIG. 6 again, it is desirable that control device 16 increases/decreases the annealing treatment time for semiconductor wafer 10 to control the annealing treatment amount. Control device 16 may measure a temperature of back surface electrode 11 using temperature sensor 13 and increase/decrease the temperature of back surface electrode 11 by heater 12 to control the annealing treatment amount. Control device 16 may increase/decrease the annealing treatment time and increase/decrease the temperature of back surface electrode 11 to control the annealing treatment amount.

Different lifetime recovery treatments are performed for the case where the recovery treatment is performed on the entire surface of semiconductor wafer 10, and for the case where the recovery treatment is performed on only a desired region in semiconductor wafer 10. FIG. 6 schematically shows a manner in which the recovery treatment is performed on the entire surface of semiconductor wafer 10 as an example. When the recovery treatment is performed on only a desired region in semiconductor wafer 10, laser annealing or the like is used. The annealing treatment is locally performed by laser annealing.

If the ON voltages of the plurality of IGBT elements 1 are deviated from a desired ON voltage, the recovery treatment is performed on the entire surface of semiconductor wafer 10. If there are variations in the distribution state of the ON voltages of the plurality of IGBT elements 1, the recovery treatment is performed on only a desired region in semiconductor wafer 10. Variations in the ON voltages in the plurality of IGBT elements 1 can be reduced by increasing the annealing treatment amount for a region having a relatively short lifetime.

(Step SA4)

Figure 8:
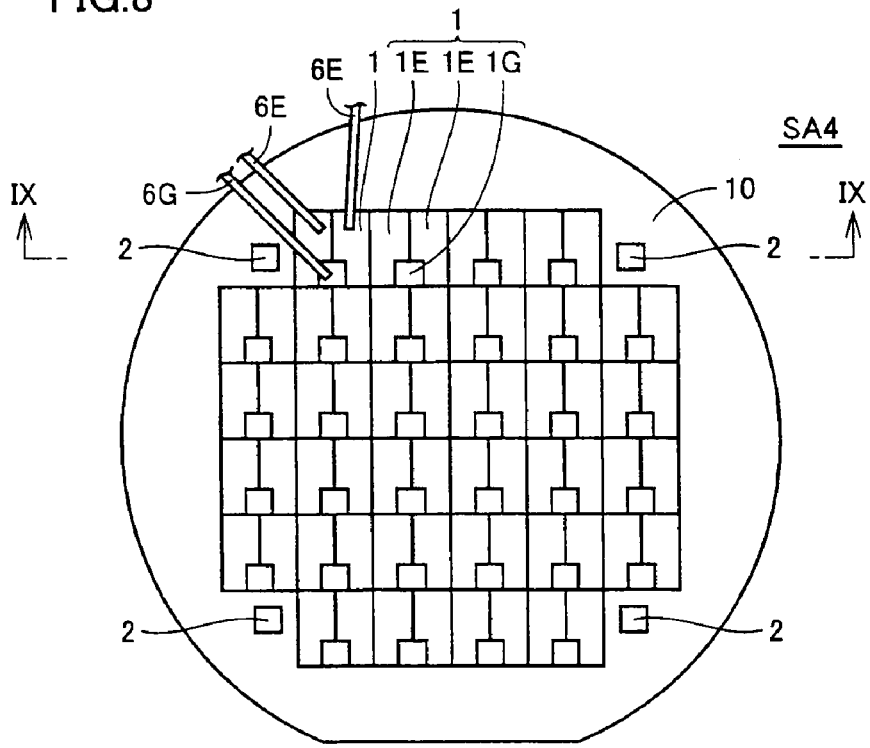
FIG. 8 is a plan view showing a fourth step of the method of manufacturing a semiconductor device in Embodiment 1.

Referring to FIG. 8, in step SA4, a probe test is performed on each IGBT element 1. A gate terminal 6G is grounded to a gate 1G of IGBT element 1. An emitter terminal 6E is grounded to an emitter 1E of IGBT element 1. Gate terminal 6G and emitter terminal 6E are each formed of a probe pin with a small diameter.

Figure 9:
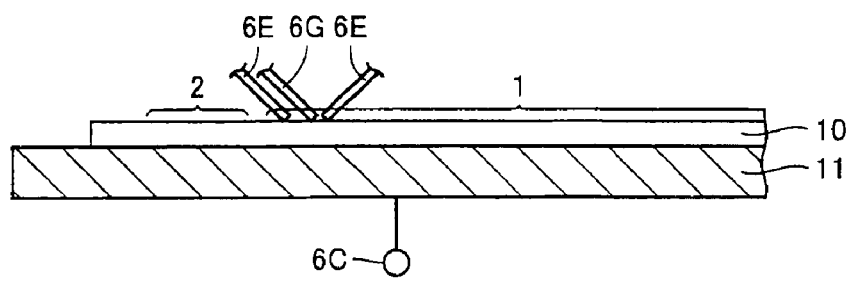
FIG. 9 is a cross sectional view taken along a line IX-IX in FIG. 8 and seen in the direction of arrows.

Referring to FIG. 9, a collector terminal 6C is grounded to back surface electrode 11 (a collector of IGBT element 1) of semiconductor wafer 10. Terminals 6G, 6E, 6C are connected to a prescribed measurement device (not shown).

In the probe test, as in step SA3 described above, a current lower than the rated current of IGBT element 1 is applied between emitter terminal 6E and gate terminal 6G.

In the probe test, the properties of each IGBT element 1 (such as an ON voltage, a gate short circuit, a withstanding voltage, a threshold voltage, or the like) when the current lower than the rated current is applied to each IGBT element 1 are measured.

For each IGBT element 1, it is determined whether or not each of the measured properties satisfies a prescribed condition (for example, whether or not it is within a standard value). Based on the determination, it is determined whether or not each IGBT element 1 formed on the surface of semiconductor wafer 10 is a conforming item. It is desirable that IGBT element 1 not satisfying the prescribed condition is subjected to mechanical or electrical marking. IGBT element 1 not satisfying the prescribed condition can be readily selected in a later step by the marking.

(Step SA5)

Figure 10:
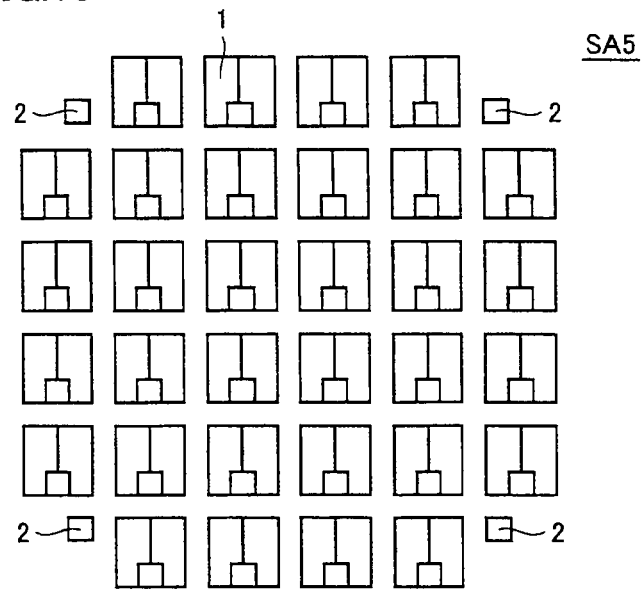
FIG. 10 is a plan view showing a fifth step of the method of manufacturing a semiconductor device in Embodiment 1.

Referring to FIG. 10, in step SA5, semiconductor wafer 10 is diced along prescribed scribe lines. Mutually independent IGBT elements 1 (main chips) are obtained.

(Step SA6)

Figure 11:
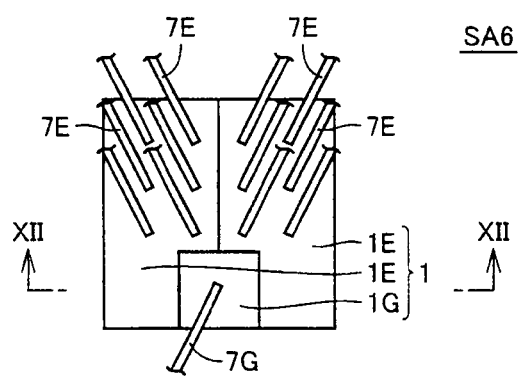
FIG. 11 is an enlarged plan view showing a sixth step of the method of manufacturing a semiconductor device in Embodiment 1.

Referring to FIG. 11, in step SA6, a chip test is performed on each IGBT element 1. A gate terminal 7G is grounded to gate 1G of IGBT element 1. A plurality of emitter terminals 7E are grounded to emitter 1E of IGBT element 1. Gate terminal 7G and the plurality of emitter terminals 7E are each formed of a probe pin with a large diameter.

Figure 12:
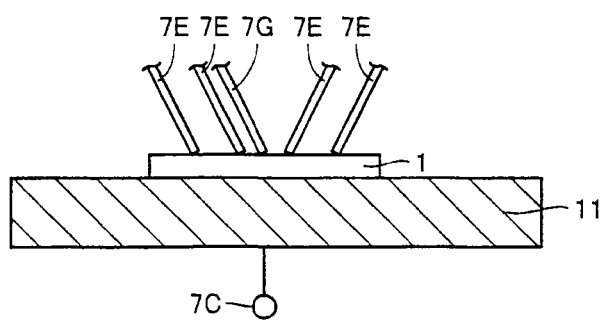
FIG. 12 is a cross sectional view taken along a line XII-XII in FIG. 11 and seen in the direction of arrows.

Referring to FIG. 12, a collector terminal 7C is grounded to back surface electrode 11 (the collector of IGBT element 1) of semiconductor wafer 10. Terminals 7G, 7E, 7C are connected to a prescribed measurement device (not shown).

In the chip test, a current equivalent to the rated current of IGBT element 1 is applied between gate terminal 7G and the plurality of emitter terminals 7E. In the chip test, the properties of each IGBT element 1 (such as an ON voltage, a gate short circuit, a withstanding voltage, a threshold voltage, or the like) are measured.

For each IGBT element 1, it is determined whether or not each of the measured properties satisfies a prescribed condition (for example, whether or not it is within a standard value). Based on the determination, it is determined whether or not each of mutually independent IGBT elements 1 is a conforming item.

(Step SA7)

Figure 13:
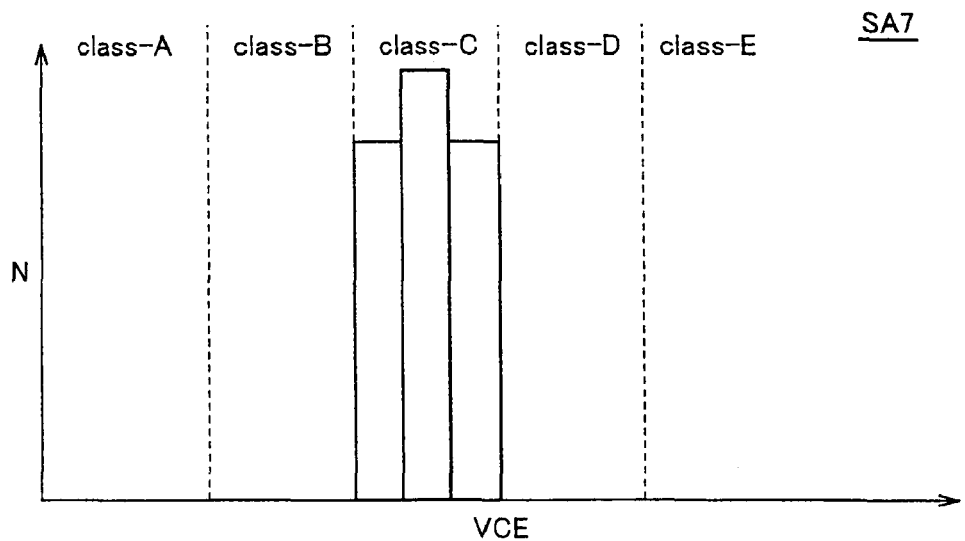
FIG. 13 is a view showing a seventh step of the method of manufacturing a semiconductor device in Embodiment 1.

Referring to FIG. 13, in step SA7, IGBT elements 1 determined as conforming items are classified (for example, into classes A to E) in accordance with the magnitude of ON voltage VCE measured when the current equivalent to the rated current is applied. IGBT elements 1 in a number N are obtained for each of classes A to E.

(Function/Effect)

When a three-phase motor such as an inverter is configured using one type of switching element (for example, IGBT element 1), IGBT elements 1 are connected in parallel. Outputs of IGBT elements 1 connected in parallel are synthesized. The outputs are changed to a drive force for the three-phase motor. To obtain a high output efficiency from 1GBT elements 1 connected in parallel, the ON voltages of IGBT elements 1 should be uniform.

According to the method of manufacturing a semiconductor device in the present embodiment, in step SA3 (see FIGS. 1 and 4 to 6), the ON voltages of the plurality of IGBT elements 1 and the distribution state of the ON voltages are monitored. At the same time, the lifetime recovery treatment is performed on IGBT elements 1 and transistors 2.

The monitoring and the lifetime recovery treatment are performed to cooperate with each other in real time. The lifetime recovery treatment is performed based on a result of the monitoring. A result of the lifetime recovery treatment is monitored, and a result of the monitoring is reflected again in the lifetime recovery treatment. By repeating this process, the ON voltages of the plurality of IGBT elements I become uniform with a high accuracy.

As shown in FIG. 13, in the present embodiment, the ON voltages of the plurality of IGBT elements 1 obtained from semiconductor wafer 10 are all included within ON voltage VCE defined as class C. According to the method of manufacturing a semiconductor device in the present embodiment, variations in ON voltages caused in a plurality of main chips obtained from a semiconductor wafer can be reduced with a high accuracy.

According to the method of manufacturing a semiconductor device in the present embodiment, measurement of the ON voltages and the lifetime recovery treatment are performed simultaneously, and thus the number of steps as a method of manufacturing a semiconductor device is reduced.

On the surface of semiconductor wafer 10 in the present embodiment, the plurality of IGBT elements 1 as main chips and four transistors 2 as cell monitors are formed. Other switching elements (a MOSFET (Metal-Oxide-Semiconductor Field-Effect Transistor), a bipolar transistor, a thyristor, or the like) may be formed as a main chip and a cell monitor on the surface of the semiconductor wafer. A switching element formed as a main chip and a switching element formed as a cell monitor may be of the same structure or of different structures.

[First Modification of Embodiment 1]

On the surface of semiconductor wafer 10 in Embodiment 1 described above, the plurality of IGBT elements 1 and four transistors 2 are formed (see FIG. 2).

Figure 14:
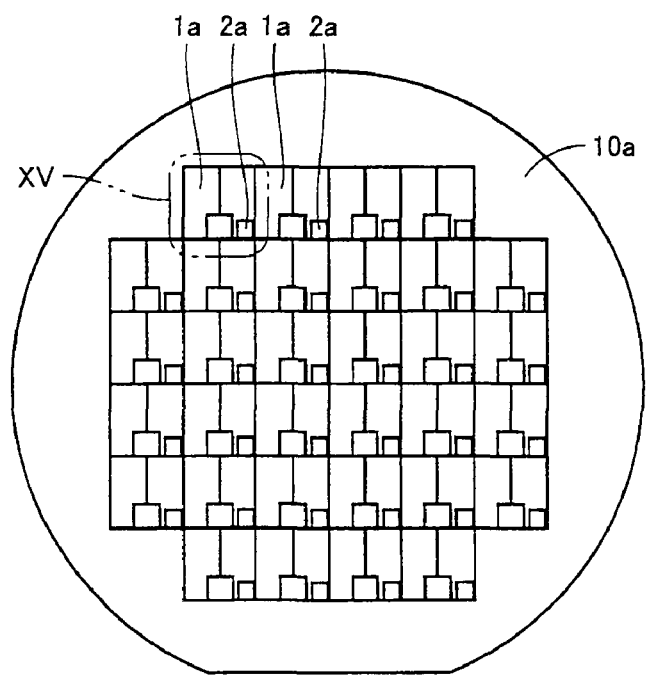
FIG. 14 is a plan view showing a first modification of the method of manufacturing a semiconductor device in Embodiment 1.
Figure 15:
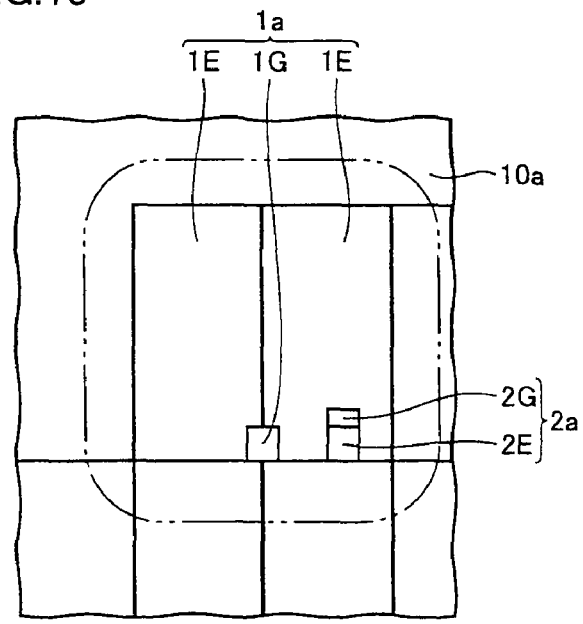
FIG. 15 is an enlarged plan view showing a region surrounded by a line XV in FIG. 14.

Referring to FIG. 14, a transistor 2*a* may be formed integrally with an IGBT element 1*a*, like a semiconductor wafer 10*a*. One transistor 2*a* is formed for one IGBT element 1*a*. FIG. 15 is an enlarged plan view showing a region surrounded by a line XV in FIG. 14. Referring to FIG. 15, gate 2G and emitter 2E constituting transistor 2*a* are formed on emitter 1E of IGBT element 1*a*.

ON voltages of transistors 2*a* are measured as in step SA3 in Embodiment 1 described above. Based on measurement results, ON voltages in IGBT elements 1 *a* and a distribution state of the ON voltages in IGBT elements 1*a* are calculated with a higher accuracy. The ON voltages of the plurality of IGBT elements 1*a* can be set to a desired value with a higher accuracy by controlling the annealing treatment amount with a higher accuracy.

[Second Modification of Embodiment 1]

On the surface of semiconductor wafer 10 in Embodiment 1 described above, the plurality of IGBT elements 1 and four transistors 2 are formed (see FIG. 2).

Figure 16:
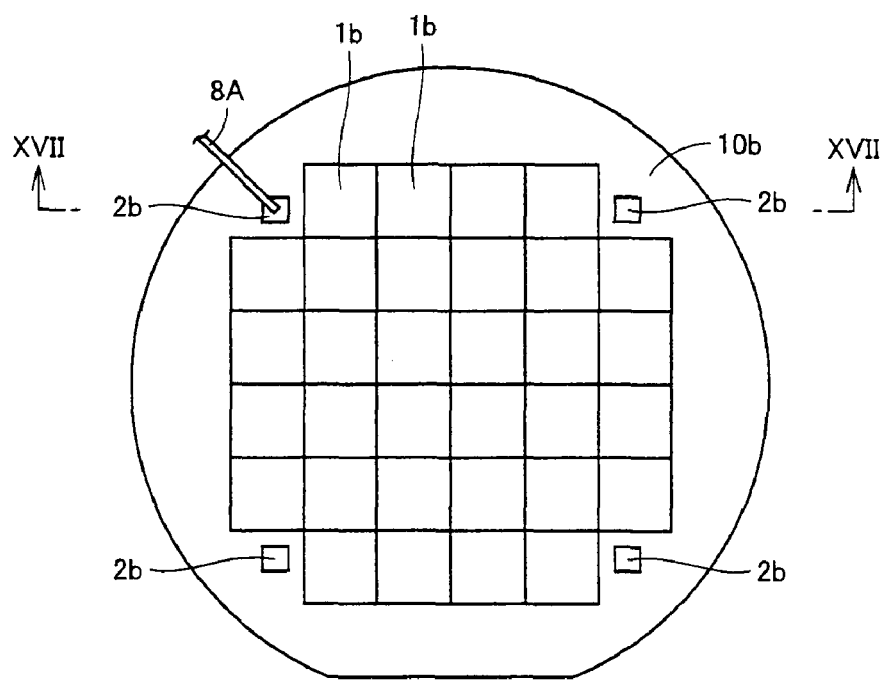
FIG. 16 is a plan view showing a second modification of the method of manufacturing a semiconductor device in Embodiment 1.

Referring to FIG. 16, on a surface of a semiconductor wafer 10*b*, a plurality of diodes 1*b* as main chips and four diodes 2*b* as cell monitors are formed. Diode 2*b* has an area smaller than an area of diode 1*b*. The area of diode 2*b* is, for example, about 1/1000 of the area of diode 1*b*.

Figure 17:
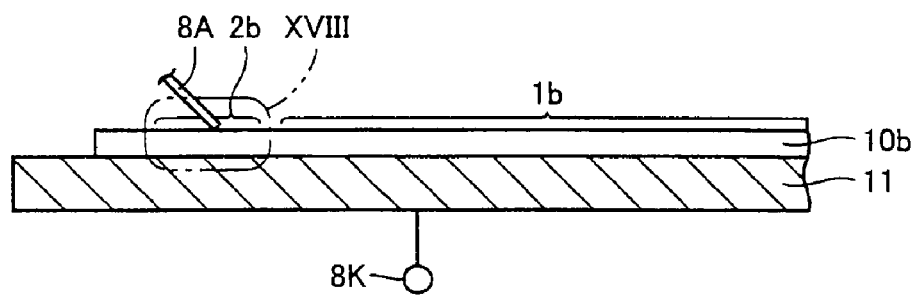
FIG. 17 is a cross sectional view taken along a line XVII-XVII in FIG. 16 and seen in the direction of arrows.
Figure 18:
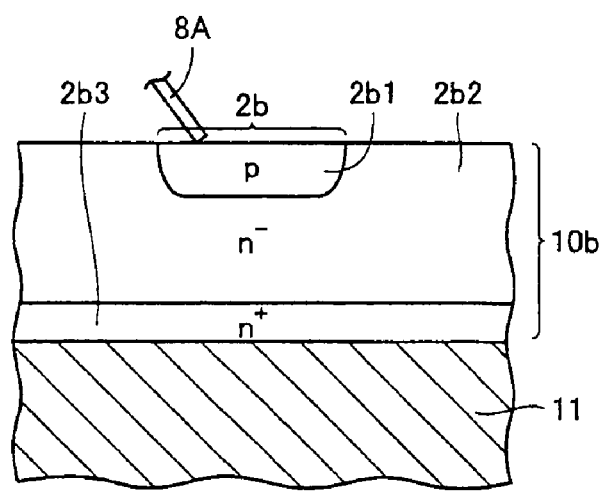
FIG. 18 is an enlarged cross sectional view showing a region surrounded by a line XVIII in FIG. 17.

Referring to FIGS. 17 and 18, diode 2*b* includes a p-type region 2*b*1, an n⁻-type region 2*b*2, and an n⁺-type region 2*b*3.

An anode terminal 8A is grounded to p-type region 2*b*1 of diode 2*b*. A cathode terminal 8K (see FIG. 17) is grounded to back surface electrode 11 (a cathode of diode 2*b*) of semiconductor wafer 10*b*. Terminals 8A, 8K are connected to a prescribed measurement device (not shown).

ON voltages (forward voltages Vf) of four diodes 2*b* are measured. Based on measurement results, ON voltages (forward voltages Vf) of the plurality of diodes 1*b* and a distribution state of the ON voltages are monitored. At the same time, a prescribed annealing treatment is performed on diodes 1*b* and diodes 2*b*. The ON voltages (forward voltages Vf) of the plurality of diodes 1*b* can be set to a desired value with a high accuracy, as in Embodiment 1 described above.

[Embodiment 2]

Figure 19:
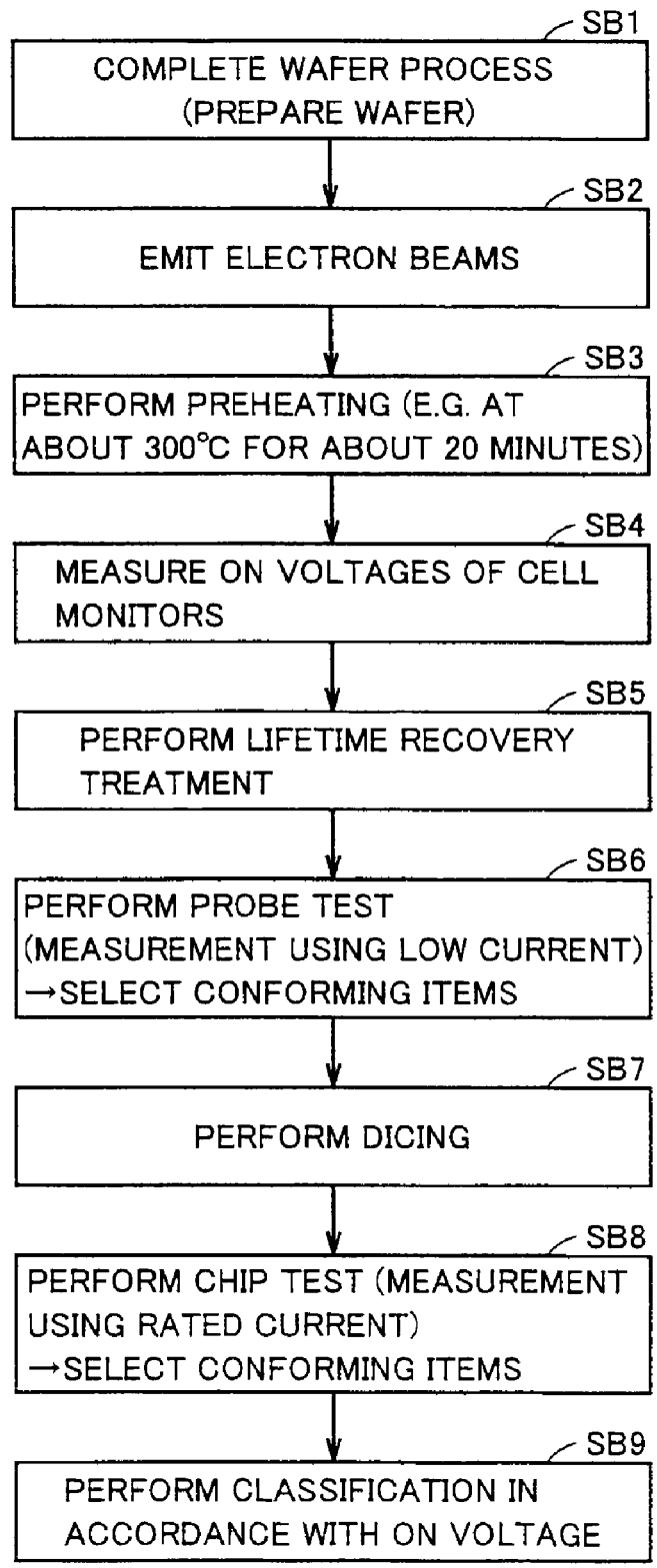
FIG. 19 is a view showing steps of a method of manufacturing a semiconductor device in Embodiment 2.

A method of manufacturing a semiconductor device in the present embodiment will be described with reference to FIGS. 19 to 26. Referring to FIG. 19, the method of manufacturing a semiconductor device in the present embodiment includes steps SB1 to SB9. Hereinafter, steps SB1 to SB9 will be described in order.

(Step SB1)

Figure 20:
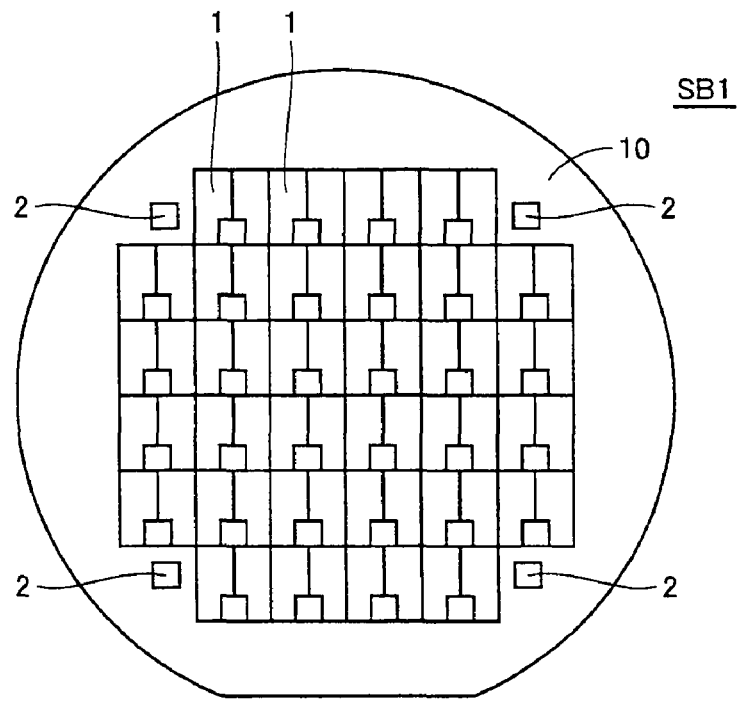
FIG. 20 is a plan view showing a first step of the method of manufacturing a semiconductor device in Embodiment 2.

Referring to FIG. 20, in step SB1, semiconductor wafer 10 for which a prescribed process has been completed is prepared as in step SA1 in Embodiment 1 described above. On the surface of semiconductor wafer 10, the plurality of IGBT elements 1 (the first semiconductor elements) and four transistors 2 (the second semiconductor elements) are formed.

(Step SB2)

Figure 21:
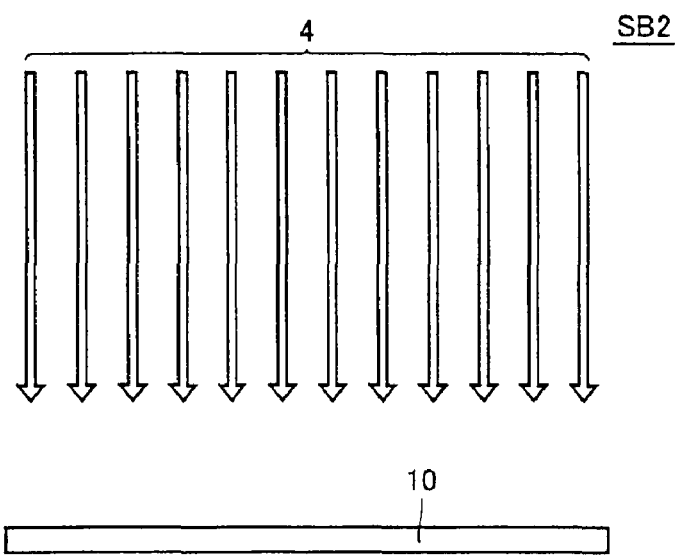
FIG. 21 is a cross sectional view showing a second step of the method of manufacturing a semiconductor device in Embodiment 2.

Referring to FIG. 21, in step SB2, electron beams 4 having a prescribed emission amount are emitted all over the surface of semiconductor wafer 10 as in step SA2 in Embodiment 1 described above. Strains occur in the substrate constituting IGBT elements 1 and transistors 2. The strains form recombination centers for minority carriers.

(Step SB3)

Figure 22:
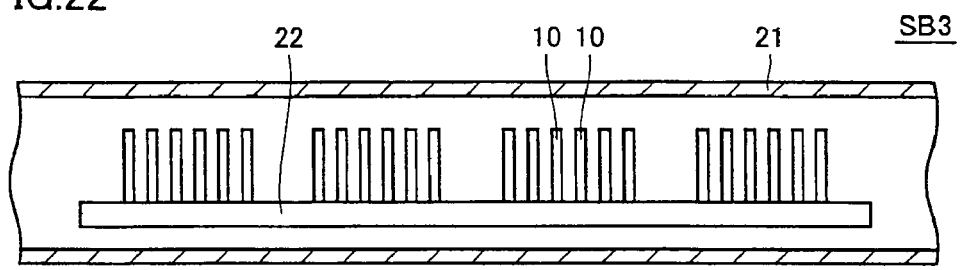
FIG. 22 is a cross sectional view showing a third step of the method of manufacturing a semiconductor device in Embodiment 2.

Referring to FIG. 22, in step SB3, semiconductor wafer 10 is subjected to a preheating treatment by an annealing furnace 21. The preheating treatment is performed at a temperature of, for example, about 300° C. A preheating treatment time is, for example, about 20 minutes. A plurality of semiconductor wafers 10 may be subjected to the preheating treatment simultaneously by fixing the plurality of semiconductor wafers 10 on a base mount 22 installed inside annealing furnace 21. Lifetimes of IGBT elements 1 and lifetimes of transistors 2 are recovered (stabilized) by the preheating treatment.

(Step SB4)

Figure 23:
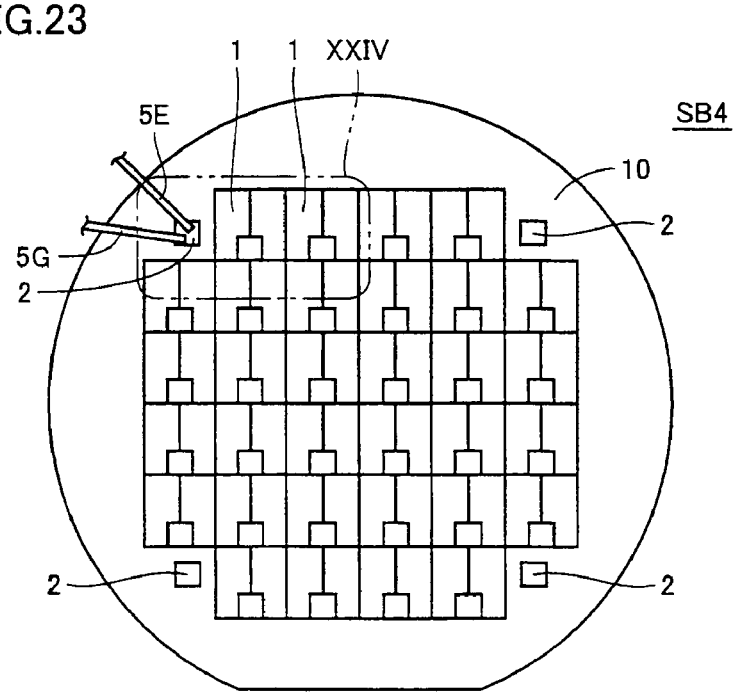
FIG. 23 is a plan view showing a fourth step of the method of manufacturing a semiconductor device in Embodiment 2.

Referring to FIG. 23, in step SB4, ON voltages of transistors 2 are measured. FIG. 23 shows a manner in which an ON voltage of one transistor 2 is measured. Preferably, it is desirable that four probe pins (the detail thereof will be described later) are prepared, and the ON voltages of transistors 2 at four corners are measured simultaneously.

Figure 24:
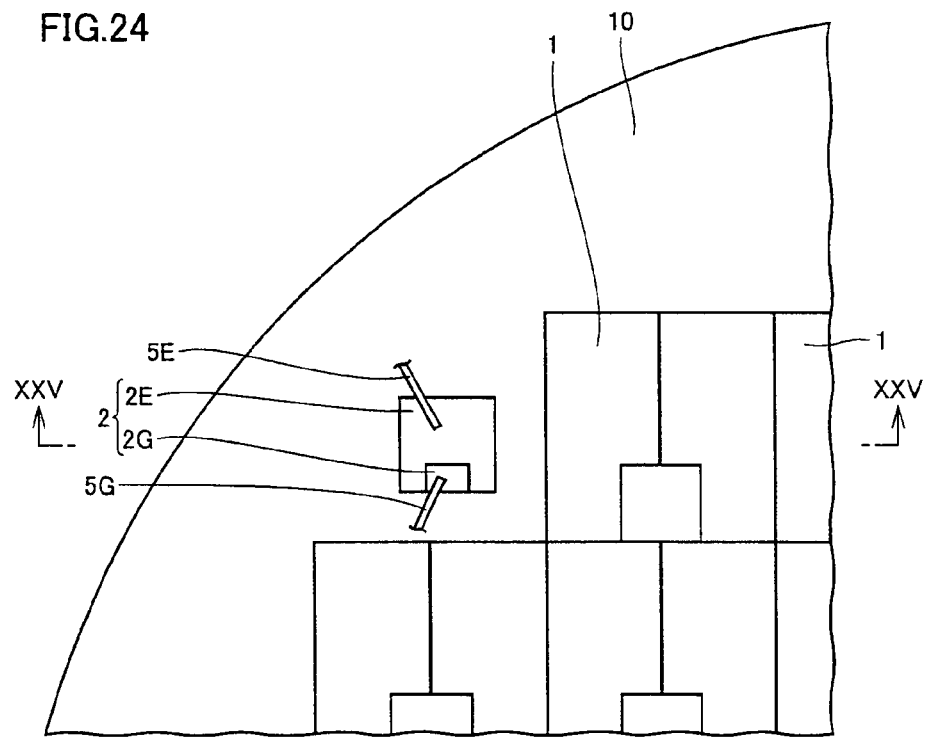
FIG. 24 is an enlarged plan view showing a region surrounded by a line XXIV in FIG. 23.

FIG. 24 is an enlarged plan view showing a region surrounded by a line XXIV in FIG. 23. Referring to FIG. 24, gate terminal 5G is grounded to gate 2G (the base) of transistor 2. Emitter terminal SE is grounded to emitter 2E of transistor 2. Gate terminal 5G and emitter terminal 5E are each formed of a probe pin with a small diameter.

Figure 25:
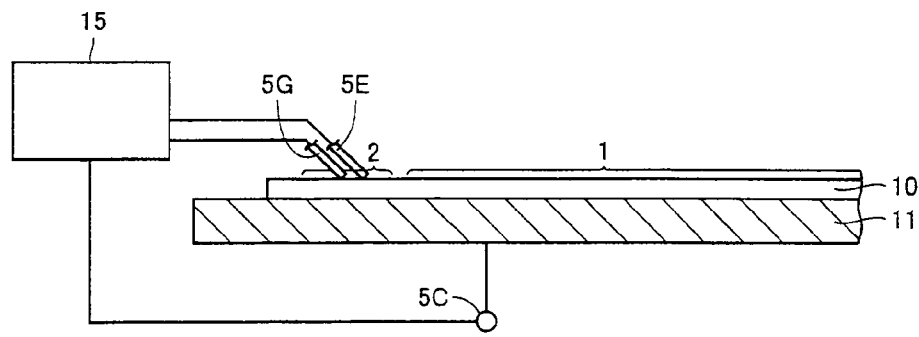
FIG. 25 is a cross sectional view taken along a line XXV-XXV in FIG. 24 and seen in the direction of arrows.

Referring to FIG. 25, collector terminal 5C is grounded to back surface electrode 11 (the collector of transistor 2) of semiconductor wafer 10. Terminals 5G, 5E, 5C are connected to measurement device 15. When the ON voltage of transistor 2 is measured, a current lower than the rated current of IGBT element 1 is applied between emitter terminal 5E and gate terminal 5G.

Properties of the plurality of IGBT elements 1 formed on semiconductor wafer 10 exhibit a certain tendency toward a prescribed direction. A distribution state of ON voltages in the plurality of IGBT elements 1 can be calculated based on measurement results of the ON voltages of transistors 2 formed at four corners.

It is also possible to calculate the ON voltages in IGBT elements 1 in an equivalent manner by setting currents to be applied to transistors 2 in accordance with rated currents of the plurality of IGBT elements 1 and current densities of the plurality of IGBT elements 1. For example, assume that the area of transistor 2 is 1/1000 of the area of IGBT element 1. If the rated currents of the plurality of IGBT elements 1 are 100 A, the currents to be applied to transistors 2 are set to 0.1 A. The ON voltages and the distribution state of the ON voltages in the plurality of IGBT elements 1 can be calculated with a high accuracy.

(Step SB5)

Figure 26:
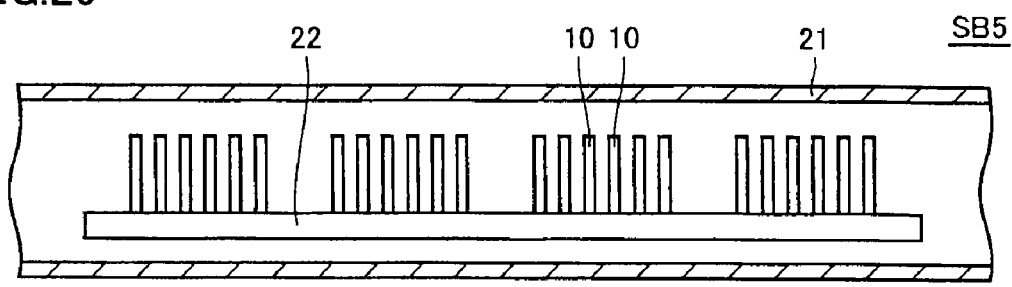
FIG. 26 is a cross sectional view showing a fifth step of the method of manufacturing a semiconductor device in Embodiment 2.

Referring to FIG. 26, in step SB5, semiconductor wafer 10 is subjected to a prescribed annealing treatment (for example, at a temperature of not less than 300° C.) using annealing furnace 21. A plurality of semiconductor wafers 10 may be subjected to the annealing treatment simultaneously by fixing the plurality of semiconductor wafers 10 on base mount 22 installed inside annealing furnace 21 as shown in FIG. 26.

The lifetimes of IGBT elements 1 and the lifetimes of transistors 2 are recovered (stabilized). An annealing treatment amount in the annealing treatment is controlled based on the ON voltages of transistors 2 measured in step SB4, such that the ON voltages of IGBT elements 1 are each equal to a desired ON voltage. The annealing treatment amount depends on temperature and time.

To control the annealing treatment amount, the annealing treatment time for semiconductor wafer 10 may be increased/decreased, an annealing temperature may be increased/decreased, or both may be increased/decreased.

Different lifetime recovery treatments are performed for the case where the recovery treatment is performed on the entire surface of semiconductor wafer 10, and for the case where the recovery treatment is performed on only a desired region in semiconductor wafer 10. FIG. 26 schematically shows a manner in which the recovery treatment is performed on the entire surface of semiconductor wafer 10 as an example. When the recovery treatment is performed on only a desired region in semiconductor wafer 10, laser annealing or the like is used. The annealing treatment is locally performed by laser annealing.

If the ON voltages of the plurality of IGBT elements 1 are deviated from a desired ON voltage, the recovery treatment is performed on the entire surface of semiconductor wafer 10. If there are variations in the distribution state of the ON voltages of the plurality of IGBT elements 1, the recovery treatment is performed on only a desired region in semiconductor wafer 10. Variations in the ON voltages in the plurality of IGBT elements 1 can be reduced by increasing the annealing treatment amount for a region having a relatively short lifetime.

(Step SB6)

Referring to FIG. 19 again, in step SB6, a probe test (using a low current) is performed on each IGBT element 1 as in step SA4 in Embodiment 1 described above (see FIGS. 8 and 9).

(Step SB7)

In step SB7, semiconductor wafer 10 is diced along prescribed scribe lines as in step SA5 in Embodiment 1 described above (see FIG. 10). Mutually independent IGBT elements 1 (main chips) are obtained.

(Step SB8)

In step SB8, a chip test is performed on each IGBT element 1 as in step SA6 in Embodiment 1 described above (see FIGS. 11 and 12). For each IGBT element 1, it is determined whether or not each of the measured properties satisfies a prescribed condition (for example, whether or not it is within a standard value). Based on the determination, it is determined whether or not each of mutually independent IGBT elements 1 is a conforming item.

(Step SB9)

In step SB9, IGBT elements 1 determined as conforming items are classified (for example, into classes A to E) in accordance with the magnitude of ON voltage VCE measured when the current equivalent to the rated current is applied, as in step SA7 in Embodiment 1 described above (see FIG. 13). IGBT elements 1 in number N are obtained for each of classes A to E.

(Function/Effect)

According to the method of manufacturing a semiconductor device in the present embodiment, in step SB3 (see FIG. 22), the preheating treatment is performed on semiconductor wafer 10. The lifetimes of IGBT elements 1 and the lifetimes of transistors 2 are recovered (stabilized) by the preheating treatment. When the ON voltages of transistors 2 are measured in step SB4, measurement results can be obtained with a higher accuracy.

In step SB5, the annealing treatment is performed based on the measurement results with a higher accuracy. The plurality of IGBT elements 1 can be subjected to the lifetime recovery treatment with a higher accuracy. The ON voltages of the plurality of IGBT elements 1 become uniform with a high accuracy. According to the method of manufacturing a semiconductor device in the present embodiment, variations in ON voltages caused in a plurality of main chips obtained from a semiconductor wafer can be reduced with a high accuracy.

Embodiment 1 described above can be combined with Embodiment 2 described above. If Embodiment 1 is combined with Embodiment 2, it is desirable that step SB3 in Embodiment 2 (the preheating treatment) is performed between step SA2 in Embodiment 1 (emitting the electron beams) and step SA3 in Embodiment 1 (performing the lifetime recovery treatment while performing monitoring).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a semiconductor device, comprising:

preparing a semiconductor wafer including a plurality of first semiconductor elements each having a first prescribed ON voltage and a plurality of second semiconductor elements each having a second prescribed ON voltage and an area smaller than that of said first semiconductor element formed on a surface thereof;

forming recombination centers in said first semiconductor elements and said second semiconductor elements by emitting prescribed radioactive rays or prescribed ions all over said surface of said semiconductor wafer; and measuring said second prescribed ON voltages of said second semiconductor elements and recovering lifetimes, defined in said first semiconductor elements and said second semiconductor elements based on the formation of said recombination centers, by subjecting said semiconductor wafer to a prescribed annealing treatment, an annealing treatment amount in said annealing treatment being controlled based on said measured second prescribed ON voltages of said second semiconductor elements, such that all of the first prescribed ON voltages of said first semiconductor elements are equal to a predetermined ON voltage when said lifetimes of said first semiconductor elements are recovered.

2. The method of manufacturing a semiconductor device according to claim 1, wherein the second semiconductor elements are formed and located independently of the first semiconductor elements.

3. The method of manufacturing a semiconductor device according to claim 2, wherein the second semiconductor elements are located at four corners of the semiconductor wafer.

4. The method of manufacturing a semiconductor device according to claim 1, wherein the second semiconductor elements are integrally formed with the first semiconductor devices.

5. The method of manufacturing a semiconductor device according to claim 1, wherein when measuring the second prescribed ON voltages, a current lower than a rated current of each first semiconductor element is applied to the second semiconductor elements.

6. A method of manufacturing a semiconductor device, comprising:

preparing a semiconductor wafer including a plurality of first semiconductor elements each having a first prescribed ON voltage and a plurality of second semiconductor elements each having a second prescribed ON voltage and an area smaller than that of said first semiconductor element formed on a surface thereof;

forming recombination centers in said first semiconductor elements and said second semiconductor elements by emitting prescribed radioactive rays or prescribed ions all over said surface of said semiconductor wafer;

recovering lifetimes, defined in said plurality of first semiconductor elements based on the formation of said recombination centers, by subjecting said semiconductor wafer to a preheating treatment;

measuring said second prescribed ON voltages of said second semiconductor elements; and recovering said lifetimes by subjecting said plurality of first semiconductor elements to a prescribed annealing treatment, an annealing treatment amount in said annealing treatment being controlled based on said measured second prescribed ON voltages of said second semiconductor elements, such that all of the first prescribed ON voltages of said first semiconductor elements are equal to a predetermined ON voltage.

* * * * *